United States Patent
Kabbani et al.

(10) Patent No.: US 9,557,375 B2
(45) Date of Patent: Jan. 31, 2017

(54) GROUP VISION ALIGNMENT FOR DOUBLE SIDED IC DEVICE TESTING

(71) Applicant: Delta Design, Inc., Poway, CA (US)

(72) Inventors: Samer Kabbani, San Marcos, CA (US); Kexiang Ken Ding, San Diego, CA (US); Kenneth B. Uekert, Ramona, CA (US); Michael Anthony Laver, El Cajon, CA (US)

(73) Assignee: Delta Design, Inc., Poway, CA (US)

( * ) Notice: Subject to any disclaimer, the term of this patent is extended or adjusted under 35 U.S.C. 154(b) by 31 days.

(21) Appl. No.: 14/744,373

(22) Filed: Jun. 19, 2015

(65) Prior Publication Data

US 2015/0369861 A1 Dec. 24, 2015

Related U.S. Application Data

(60) Provisional application No. 62/015,253, filed on Jun. 20, 2014.

(51) Int. Cl.
*G01R 31/308* (2006.01)
*G01R 31/28* (2006.01)

(52) U.S. Cl.
CPC ....... *G01R 31/2891* (2013.01); *G01R 31/2893* (2013.01)

(58) Field of Classification Search
CPC ............ G01R 31/2891; G01R 31/2863; G01R 21/9501; G01R 21/93; H01L 2224/131; H01L 21/681; H01L 2924/014
USPC .... 324/500, 756.02, 756.03–756.07, 759.03, 324/762.01–762.06, 763.02, 324/754.07–754.1, 750.16, 750.15; 33/286, 645; 438/94–95, 190; 29/739–740, 743, 759
See application file for complete search history.

(56) References Cited

U.S. PATENT DOCUMENTS

| | | | |
|---|---|---|---|
| 7,506,451 B1 | 3/2009 | Ding et al. | |
| 7,842,912 B2 | 11/2010 | Ding et al. | |
| 8,106,349 B2 | 1/2012 | Ding et al. | |
| 8,281,483 B2 * | 10/2012 | Hofmann | G01R 1/0425 29/739 |
| 8,773,530 B2 * | 7/2014 | Ding | H01L 21/67259 348/135 |

* cited by examiner

*Primary Examiner* — Melissa Koval
*Assistant Examiner* — Trung Nguyen
(74) *Attorney, Agent, or Firm* — Foley & Lardner LLP (57) ABSTRACT

A system for double sided integrated circuit device testing includes: (i) a picking section including: (a) a plurality of picking-section pockets; (b) a picking-section plate including: one or more picking-section pocket openings, and first and second picking-section plate pins; (ii) a placing section including: (a) a plurality of placing-section contactors; (b) a placing-section member including: one or more placing-section contactor openings, and first and second placing-section member pins; and (iii) a pick-and-place section including: (a) a pick-and-place device including: a plurality of pick-and-place head contactors, and one or more sets of actuators; and (b) a pick-and-place head plate including: one or more pick-and-place head contactor openings, each pick-and-place head contactor opening corresponding to a pick-and-place head contactor, and first and second spring-loaded bushings configured to engage with the first and second picking-section plate pins, and the first and second placing-section member pins.

25 Claims, 8 Drawing Sheets

GROUP VISION ALIGNMENT FOR DOUBLE SIDED IC DEVICE TESTING

CROSS-REFERENCE TO RELATED APPLICATIONS

This application claims the benefit under 35 U.S.C. §119 of U.S. Provisional Patent Application No. 62/015,253, filed on Jun. 20, 2015, which is hereby incorporated by reference in its entirety.

FIELD OF THE INVENTION

The present disclosure relates generally to a device testing and handling system and more particularly to a camera based visional alignment system for double sided IC device testing.

BACKGROUND OF THE INVENTION

The following description of the background of the invention is provided simply as an aid in understanding the invention and is not admitted to describe or constitute prior art to the invention.

Semiconductor devices are commonly tested using specialized processing equipment. The processing equipment may be used to identify defective products and other various characteristics related to the performance of such devices. In most cases, the processing equipment possesses mechanisms for handling devices under test. In order to ensure accurate testing, handling mechanisms must be able to correctly align the device under test with various other testing tools and equipment. Correct alignment of the devices is essential for efficient testing.

Various systems are used to position and align devices for testing, sorting and other functions. Generally, alignment is achieved using a mechanical alignment system. However, mechanical alignment is only accurate within certain manufacturing ranges and is not ideal for precise alignment operations. Further, modern devices with finer pitches are driving the need for optically assisted alignment, or "vision alignment," as an alternative to mechanical alignment.

Conventional vision alignment systems used for aligning devices in a two dimensional coordinate system use the three axis motion control of an actuator set to align one device to a contactor in x, y and theta (rotation angle) directions.

Accordingly, each device is aligned independently by a set of actuators. However, for a test handler used to simultaneously test an increased number of devices, there is typically no space to put more actuator sets to align each device individually. Additionally, increasing the number of actuators also dramatically increases the system cost.

Devices and methods that address these issues are described in, for example, U.S. Pat. No. 7,506,451, U.S. Pat. No. 8,106,349, and U.S. Pat. No. 7,842,912, all of which are assigned to the Assignee of the present application and are incorporated by reference in their entireties. The devices and methods described in these patents are particularly advantageous for use with single sided IC device testing.

SUMMARY OF THE INVENTION

In one embodiment, a system for double sided integrated circuit device testing is provided. The system includes: (i) a picking section comprising: (a) a plurality of picking-section pockets, each picking-section pocket configured to hold an integrated circuit device; (b) a picking-section plate comprising: one or more picking-section pocket openings, each picking-section pocket opening corresponding to one of the picking-section pockets, and first and second picking-section plate pins extending from a surface of the picking-section plate; (ii) a placing section comprising: (a) a plurality of placing-section contactors; (b) a placing-section member comprising: one or more placing-section contactor openings, each placing-section contactor opening corresponding to a placing-section contactor, and first and second placing-section member pins extending from a surface of the placing-section member; and (iii) a pick-and-place section comprising: (a) a pick-and-place device comprising: a plurality of pick-and-place head contactors, and one or more sets of actuators configured to adjust an X position, Y position, and angle of rotation of the plurality of pick-and-place head contactors, wherein the pick-and-place device is configured to transport a plurality of the integrated circuit devices from the plurality of picking-section pockets to the plurality of placing-section contactors; and (b) a pick-and-place head plate comprising: one or more pick-and-place head contactor openings, each pick-and-place head contactor opening corresponding to a pick-and-place head contactor, and first and second spring-loaded bushings configured to engage with the first and second picking-section plate pins, and the first and second placing-section member pins.

In one aspect, the system further includes a first camera configured to view the picking-section plate and a plurality of integrated circuit devices located in the picking-section pockets; and a second camera configured to view the pick-and-place head plate and a plurality of integrated circuit devices located in the pick-and-place head contactors.

In one aspect, the system further includes at least one controller configured to: control the one or more sets of actuators to correct an offset between first terminal arrays on first sides of the plurality of integrated circuit devices, and the plurality of pick-and-place head contactors, based on data received from the first camera, and control the one or more sets of actuators to correct an offset between second terminal arrays on second sides of the plurality of integrated circuit devices, and the plurality of placing-section contactors, based on data received from the second camera.

In one aspect, the at least one controller is configured to determine the offset between the first terminal arrays and the plurality of pick-and-place head contactors based on virtual images of the pick-and-place head contactors that are mapped to the picking-section plate, by determining an offset between the first terminal arrays and the picking-section pocket openings.

In one aspect, the at least one controller is configured to determine the offset between the second terminal arrays and the plurality of placing-section contactors based on virtual images of the placing-section contactors that are mapped to the pick-and-place head plate, by determining an offset between the second terminal arrays and the pick-and-place head contactor openings.

In one aspect, the at least one controller is configured to determine the offset between the first terminal arrays and the plurality of pick-and-place head contactors based on virtual images of the pick-and-place head contactors that are mapped to the picking-section plate, by determining an offset between the first terminal arrays and the picking-section pocket openings, and the at least one controller is configured to determine the offset between the second terminal arrays and the placing-section contactors based on virtual images of the placing-section contactors that are mapped to the pick-and-place head plate, by determining an offset between the second terminal arrays and the pick-and-place head contactor openings.

In one aspect, the pick-and-place device includes one set of the actuators for each of the pick-and-place head contactors.

In one aspect, the pick-and-place device includes one set of actuators configured to sequentially align two or more of the pick-and-place head contactors.

In one aspect, the pick-and-place device is configured such that, after a first pick-and-place head contactor is aligned, said first pick-and-place head contactor can be locked in a corrected position before a second pick-and-place head contactor is aligned.

In one aspect, each of the one or more sets of actuators includes three linear actuators.

In one aspect, the linear actuators are micro-motor based linear actuators.

In one aspect, the linear actuators are shape memory alloy based linear actuators.

In one aspect, the first spring-loaded bushing is spring-loaded in two dimensions so as to (i) provide origin alignment between the picking-section plate and the pick-and-place head plate when the picking-section plate is engaged with the pick-and-place head plate, and (ii) provide origin alignment between the placing-section member and the pick-and-place head plate when the placing-section member is engaged with the pick-and-place head plate.

In one aspect, the second spring-loaded bushing is spring-loaded in one dimension so as to (i) provide angle alignment between the picking-section plate and the pick-and-place head plate when the picking-section plate is engaged with the pick-and-place head plate, and (ii) provide angle alignment between the placing-section member and the pick-and-place head plate when the placing-section member is engaged with the pick-and-place head plate.

In one aspect, the first spring-loaded bushing is spring-loaded in two dimensions so as to (i) provide origin alignment between the picking-section plate and the pick-and-place head plate when the picking-section plate is engaged with the pick-and-place head plate, and (ii) provide origin alignment between the placing-section member and the pick-and-place head plate when the placing-section member is engaged with the pick-and-place head plate, and the second spring-loaded bushing is spring-loaded in one dimension so as to (i) provide angle alignment between the picking-section plate and the pick-and-place head plate when the picking-section plate is engaged with the pick-and-place head plate, and (ii) provide angle alignment between the placing-section member and the pick-and-place head plate when the placing-section member is engaged with the pick-and-place head plate.

In one aspect, the picking-section pocket openings extend entirely through the picking-section plate so as to be visible from both sides of the picking-section plate.

In one aspect, the pick-and-place head contactor openings extend entirely through the pick-and-place head plate so as to be visible from both sides of the pick-and-place head plate In one aspect, the picking-section plate includes a plurality of fiducials on said surface of the picking-section plate.

In one aspect, the pick-and-place head plate includes a plurality of fiducials on said surface of the pick-and-place head plate.

In one aspect, the picking-section plate includes a plurality of fiducials on said surface of the picking-section plate, and the at least one controller is configured to determine the offset between the first terminal arrays and the plurality of pick-and-place head contactors based on virtual images of the pick-and-place head contactors that are mapped to the picking-section plate, by determining an offset between the first terminal arrays and the plurality of fiducials.

In one aspect, the pick-and-place head plate includes a plurality of fiducials on said surface of the pick-and-place head plate, and the at least one controller is configured to determine the offset between the second terminal arrays and the placing-section contactors based on virtual images of the placing-section contactors that are mapped to the pick-and-place head plate, by determining an offset between the second terminal arrays and the plurality of fiducials.

In one aspect, the picking-section plate includes a first plurality of fiducials on said surface of the picking-section plate, the at least one controller is configured to determine the offset between the first terminal arrays and the plurality of pick-and-place head contactors based on virtual images of the pick-and-place head contactors that are mapped to the picking-section plate, by determining an offset between the first terminal arrays and the first plurality of fiducials, the pick-and-place head plate includes a second plurality of fiducials on said surface of the pick-and-place head plate, and the at least one controller is configured to determine the offset between the second terminal arrays and the placing-section contactors based on virtual images of the placing-section contactors that are mapped to the pick-and-place head plate, by determining an offset between the second terminal arrays and the second plurality of fiducials.

In one embodiment, a method of performing double sided integrated circuit device testing is provided. The method includes: providing a system for double sided integrated circuit device testing, the system comprising: (i) a picking section comprising: (a) a plurality of picking-section pockets, each picking-section pocket configured to hold an integrated circuit device, (b) a picking-section plate comprising: one or more picking-section pocket openings, each picking-section pocket opening corresponding to one of the picking-section pockets, and first and second picking-section plate pins extending from a surface of the picking-section plate, (ii) a placing section comprising: (a) a plurality of placing-section contactors, (b) placing-section member comprising: one or more placing-section contactor openings, each placing-section contactor opening corresponding to a placing-section contactor, and first and second placing-section member pins extending from a surface of the placing-section member, and (iii) a pick-and-place section comprising: (a) a pick-and-place device comprising: a plurality of pick-and-place head contactors, and one or more sets of actuators configured to adjust an X position, Y position, and angle of rotation of the plurality of pick-and-place head contactors, wherein the pick-and-place device is configured to transport a plurality of the integrated circuit devices from the plurality of picking-section pockets to the plurality of placing-section contactors, and (b) a pick-and-place head plate comprising: one or more pick-and-place head contactor openings, each pick-and-place head contactor opening corresponding to a pick-and-place head contactor, and first and second spring-loaded bushings configured to engage with the first and second picking-section plate pins, and the first and second placing-section member pins; viewing a picking-section plate and a plurality of integrated circuit devices located in picking-section pockets with a first camera; controlling the one or more sets of actuators to correct an offset between first terminal arrays on first sides of the plurality of integrated circuit devices, and the plurality of pick-and-place head contactors, based on data received from the first camera; picking the plurality of integrated circuit devices from the picking-section pockets such that the plurality of integrated circuit devices engage with the pick-and-place head contactors; viewing the pick-and-place head plate and the plurality of integrated circuit devices located in the pick-and-place head contactors with a second camera; controlling the one or more sets of actuators to correct an offset between the second terminal arrays on second sides of the plurality of integrated circuit devices, and the plurality of placing-section contactors, based on data received from the second camera; and placing the plurality of integrated circuit devices into the placing-section contactors.

In one aspect, the method further comprises a step of calibrating the system, wherein the step of calibrating the system comprises: mounting the picking-section plate on the pick-and-place head plate such that the first and second picking-section plate pins engage the first and second spring-loaded bushings; viewing the picking-section plate mounted on the pick-and-place head plate with the second camera; and mapping the plurality of pick-and-place head contactors as virtual images to the picking-section plate.

In one aspect, the step of calibrating the system further comprises: mounting the pick-and-place head plate on the placing-section member such that the first and second placing-section member pins engage the first and second spring-loaded bushings; viewing the pick-and-place head plate mounted on the placing-section member with a third camera; and mapping the plurality of placing-section contactors as virtual images to the pick-and-place head plate.

BRIEF DESCRIPTION OF THE DRAWINGS

Embodiments of the invention are described by referring to the attached drawings, in which.

DETAILED DESCRIPTION

In the following description, for purposes of explanation and not limitation, details and descriptions are set forth in order to provide a thorough understanding of embodiments of the present invention. However, it will be apparent to those skilled in the art that the present invention may be practiced in other embodiments that depart from these details and descriptions. For example, while the embodiments below are described in reference to a mechanism used to transport a device to and from a test site, the mechanism may be used in other applications.

A system 100 for double sided integrated circuit device testing and various components thereof according to one embodiment of the present invention are shown in FIGS. 1-6.

Figure 1:
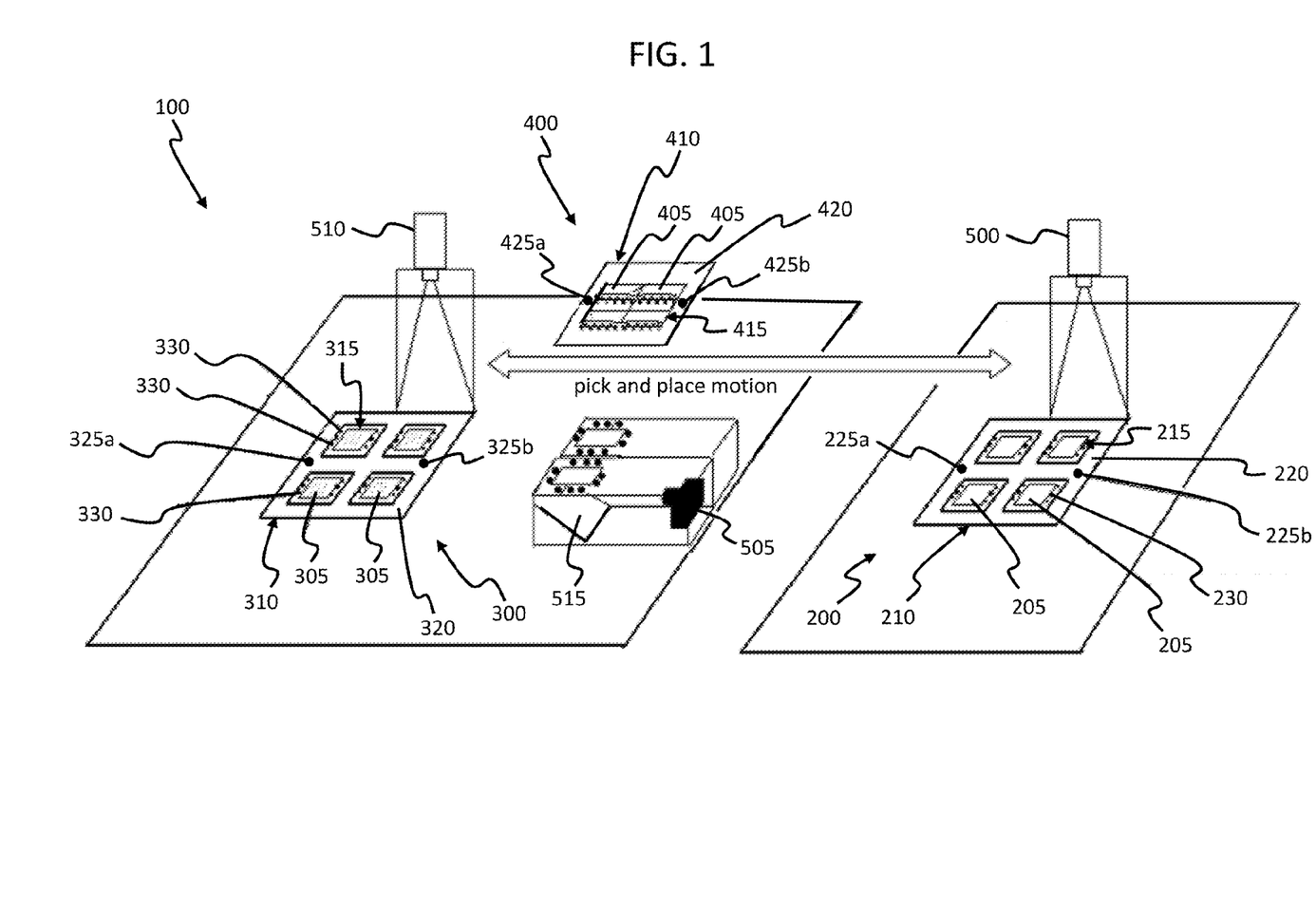
FIG. 1 is a schematic view of a system for double sided integrated circuit device testing according to an embodiment of the invention.

As shown in FIG. 1, the system 100 includes a picking section 200, and placing section 300, a pick-and-place section 400, an optical sensing system including a first camera 500, a second camera 505, and a third camera 510, and a controller 600. Each of these components will be described in detail below.

Picking Section

Figure 2:
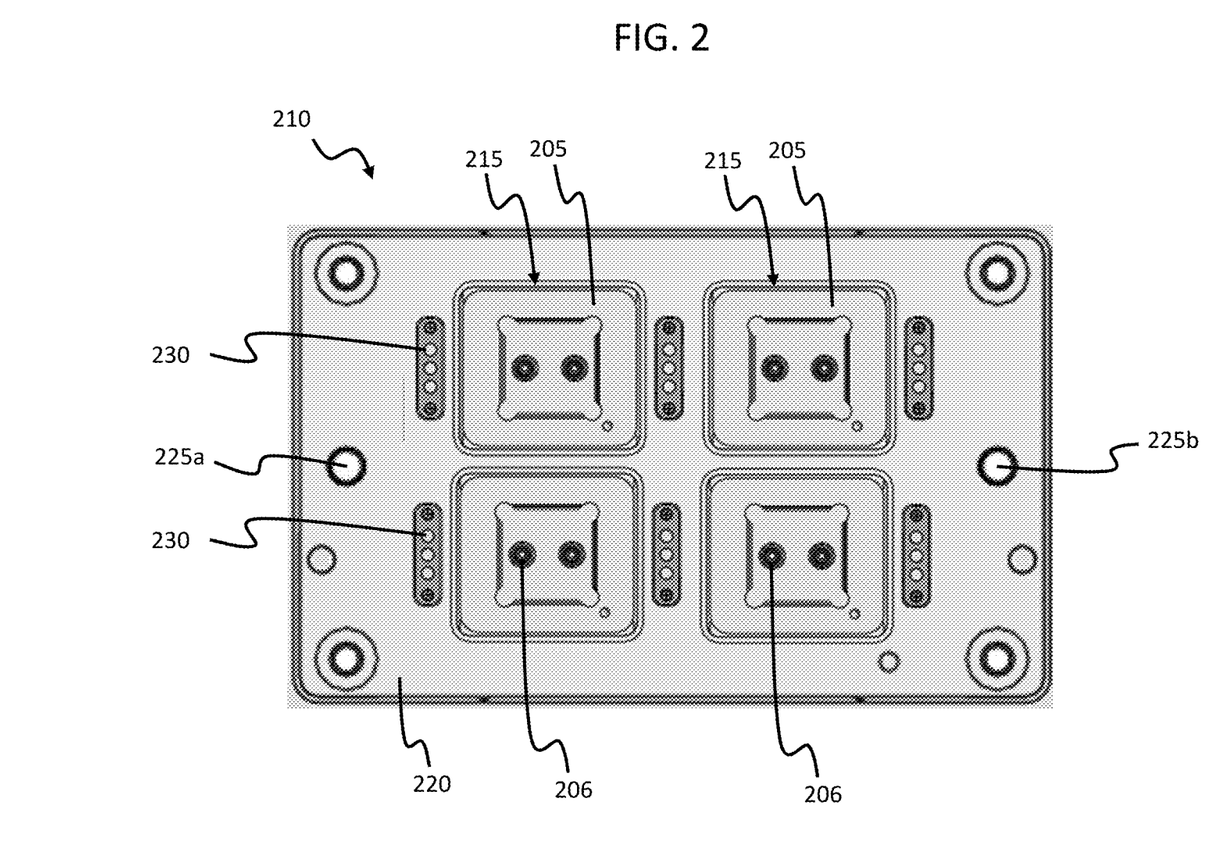
FIG. 2 is a top view of a picking-section plate according to an embodiment of the invention.

First, the picking section 200 will be described with reference to FIGS. 1 and 2. The picking section 200 is configured for supplying integrated circuit devices to be tested to the pick-and-place section 400. The picking section 200 includes a plurality of picking-section pockets 205. In this embodiment, the picking section 200 includes a 2×2 array of picking-section pockets 205. The array may be an array larger than 2×2 (for example, 4×4, 8×8, or larger). Each picking-section pocket 205 is configured to hold an integrated circuit device. Each picking-section pocket 205 includes a suction device with a suction opening 206, for holding integrated circuit devices in the picking-section pockets. The picking-section pockets 205 are located on a shuttle (not shown), which is configured to move integrated circuit devices from a first location, where devices are loaded onto the shuttle, to a second location, wherein devices can be picked up by the pick-and-place section 400.

The picking section 200 includes a picking-section plate 210. The picking-section plate 210 is a flat plate having a top surface 220, and an opposing bottom surface (not shown). A plurality of picking-section pocket openings 215 extend entirely through the picking-section plate 210 from the top surface 220 to the bottom surface, so as to be visible from both sides of the picking-section plate 210. The picking-section pocket openings 215 therefore allow for defining a common coordinate between at least one first, downward looking camera 500 viewing the top surface 220 of the picking-section plate 210, and at least one second, upward looking camera 505 viewing the bottom surface of the picking-section plate 210. In this embodiment, the picking-section plate 210 includes a 2×2 array of picking-section pocket openings 215. The array may be an array larger than 2×2 (for example, 4×4, 8×8, or larger). Each picking-section pocket opening 215 corresponds to one picking-section pocket 205, such that the picking-section pockets 205 are visible through the picking-section pocket openings 215 when the picking-section plate 210 is mounted on the picking-section pockets 205.

The picking-section plate 210 includes a first picking-section plate pin 225a and a second picking-section plate pin 225b. The first picking-section plate pin 225a is configured such that it can be located in a first spring loaded bushing 435a of a pick-and-place head plate 420, as described in more detail below. The second picking-section plate pin 225b is configured such that it can be located in a second spring loaded bushing 435b of a pick-and-place head plate 420, as also described in more detail below.

The picking-section plate 210 includes a plurality of picking-section plate fiducials 230 on the top surface thereof. As shown in FIG. 2, a plurality of fiducials 230 are provided on each lateral side of each picking-section pocket opening 215. The purpose of the fiducials 230 is described in more detail below.

Placing Section

Figure 3:
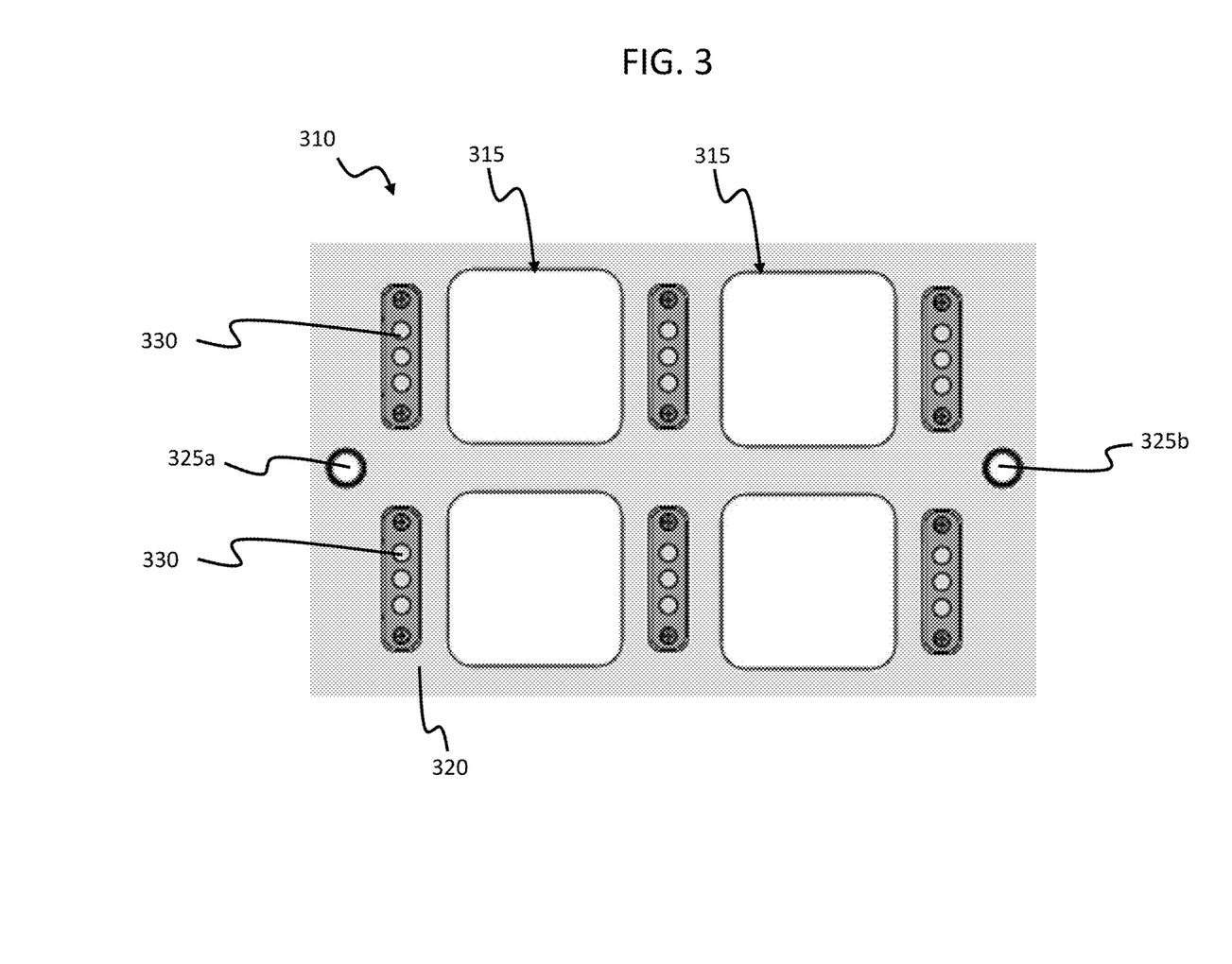
FIG. 3 is a top view of a placing-section member according to an embodiment of the invention.

Next, the placing section 300 will be described with reference to FIGS. 1 and 3. The placing section 300 is configured for testing bottom terminal arrays of the integrated circuit devices. The placing section 300 includes a plurality of placing-section contactors 305. In this embodiment, the placing section 300 includes a 2×2 array of placing-section contactors 305. Each placing-section contactor 305 is configured to test a bottom terminal array of an integrated circuit device.

The placing section 300 includes a placing-section member 310. The placing-section member 310 is a member having a top surface 320. A plurality of placing-section contactor openings 315 are located on the top surface 320 of the placing-section member 310. In this embodiment, the placing-section member 310 includes a 2×2 array of placing-section contactor openings 315. Each placing-section contactor opening 315 corresponds to one placing-section contactor 305, such that the placing-section contactors 305 are visible through the placing-section contactor openings 315.

The placing-section member 310 includes a first placing-section member pin 325a and a second placing-section member pin 325b. The first placing-section member pin 325a is configured such that it can be located in a first spring loaded bushing 435a of the pick-and-place head plate 420, as described in more detail below. The second placing-section member pin 325b is configured such that it can be located in a second spring loaded bushing 435b of the pick-and-place head plate 420, as also described in more detail below. A distance between the first placing-section member pin 325a and the second placing-section member pin 325b is the same as a distance between the first picking-section plate pin 225a and the second picking-section plate pin 225b.

The placing-section member 310 includes a plurality of placing-section member fiducials 330 on the top surface thereof. As shown in FIG. 3, a plurality of fiducials 330 are provided on each lateral side of each placing-section contactor opening 315. These fiducials can be used when the placing-section contactor 305 is replaced, as discussed in more detail below in the subsection entitled "Calibration of the System."

Pick-and-Place Section

Next, the pick-and-place section 400 will be described with reference to FIGS. 1, 4A, and 4B. The pick-and-place section 400 includes a pick-and-place device 435 and a pick-and place head plate 410 that is attachable to the pick-and-place device 435. The pick-and-place device 435 is configured for testing bottom terminal arrays of the integrated circuit devices, and for transporting devices from the picking-section pockets 205 of the picking-section 200 to the placing-section contactors 305 of the placing-section 300. The pick-and place device 435 includes a plurality of pick-and-place head contactors 405. In this embodiment, the pick-and place device 435 includes a 2×2 array of pick-and-place head contactors 405. Each pick-and-place head contactor 405 is configured to test a top terminal array of an integrated circuit device.

The pick-and-place device 435 includes one or more sets of actuators configured to adjust an X position, Y position, and angle of rotation of the plurality of pick-and-place head contactors 405. The pick-and-place device 435 shown in FIGS. 4A and 4B includes a first actuator 440a, a second actuator 440, and a third actuator 440c. In this embodiment, the pick-and-place device includes one set of actuators configured to sequentially align all of the pick-and-place head contactors 405. After a first pick-and-place head contactor 405 is aligned, that first pick-and-place head contactor 405 can be locked in a corrected position (e.g., a z-axis rest position) before a second pick-and-place head contactor 405 is aligned. This process is then repeated for the remaining pick-and-place head contactors 405. The mechanism for performing alignment in this manner is described in U.S. Pat. No. 8,106,349. The actuators 440a, 440b, 440c are linear actuators. The actuators 440a and 440c are configured to move respective sides of the pick-and-place head contactors 405 in a first direction (e.g., the X-direction). The actuator 440b is configured to move the pick-and-place head contactors 405 in a second direction (e.g., the Y-direction). Thus, the actuators 440a and 440c can be used, to adjust both an overall X-position and an angle of the pick-and-place head contactors 405, while the actuator 440b can be used to adjust an overall Y-position of the pick-and-place head contactors 405. The actuators 440a, 440b, and 440c shown in FIGS. 4A and 4B are micro-motor based linear actuators. A linear encoder is provided for each of the actuators 440a, 440b, 440c.

The pick-and-place head plate 410 is a flat plate having a bottom surface 420, and an opposing top surface (not shown). A plurality of pick-and-place head contactor openings 415 extend entirely through the pick-and-place head plate 310 from the bottom surface 420 to the top surface, so as to be visible from both sides of the pick-and-place head plate 410. The pick-and-place head contactor openings 415 therefore allow for defining a common coordinate between at least one downward looking camera 500 viewing the top surface of the pick-and-place head plate 410, and at least one upward looking camera 505 viewing the bottom surface 420 of the pick-and-place head plate 410. In this embodiment, the pick-and-place head plate 410 includes a 2×2 array of pick-and-place head contactor openings 415. Each pick-and-place head contactor opening 415 corresponds to one pick-and-place head contactor 405, such that the pick-and-place head contactors 405 are visible through the pick-and-place head contactor openings 415 when the pick-and-place head plate 410 is mounted on the pick-and-place device 435.

Figure 5A:
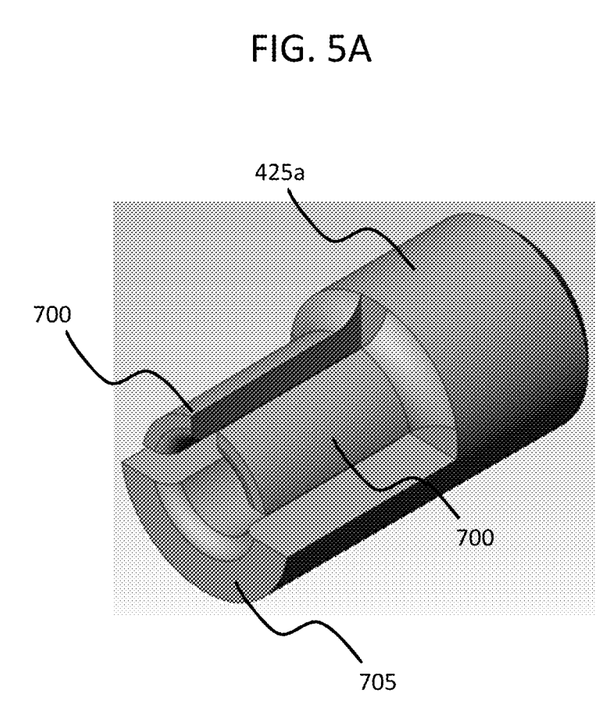
FIG. 5A is a side perspective view of a first spring-loaded bushing for origin alignment according to an embodiment of the invention.
Figure 5B:
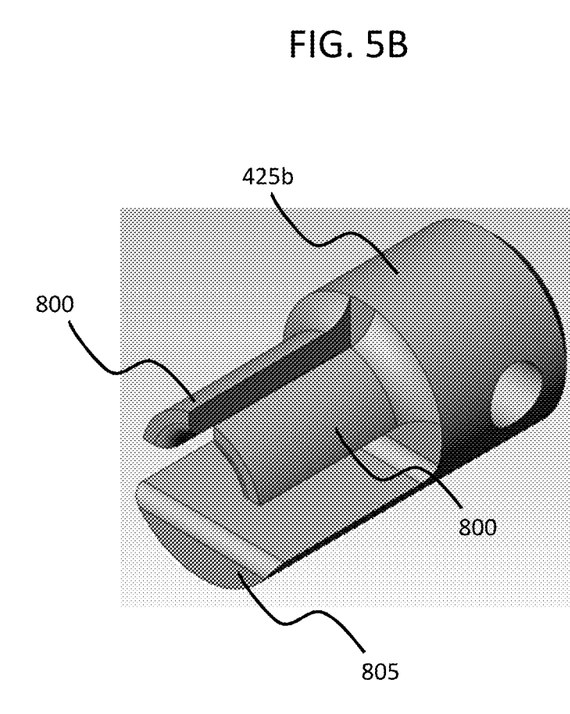
FIG. 5B is a side perspective view of a second spring-loaded bushing for angle alignment according to an embodiment of the invention.

The pick-and-place head plate 410 includes a first spring-loaded bushing 425a, shown in FIG. 5A, and a second spring-loaded bushing 425b, shown in FIG. 5B. The first spring-loaded bushing 425a is configured such that the first picking-section plate pin 225a and the first placing section member pin 325a can be located in the first spring-loaded bushing 425a. The second spring-loaded bushing 425b is configured such that the second picking-section plate pin 225b and the second placing section member pin 325b can be located in the second spring-loaded bushing 425b. A distance between the first spring-loaded bushing 425a and the second spring-loaded bushing 425b is the same as the distance between first placing-section member pin 325a and the second placing-section member pin 325b, and the same as the distance between the first picking-section plate pin 225a and the second picking-section plate pin 225b.

The first spring-loaded bushing 425a is spring-loaded in two dimensions so as to (i) provide origin alignment between the picking-section plate 210 and the pick-and-place head plate 410 when the picking-section plate 210 is engaged with the pick-and-place head plate 410, and (ii)

provide origin alignment between the placing-section member 310 and the pick-and-place head plate 410 when the placing-section member 310 is engaged with the pick-and-place head plate 410. To that end, the first spring-loaded bushing 425a includes at least one spring bushing member 700 having a curved inner surface on a first side of the first spring-loaded bushing 425a (e.g., two spring bushing members 700, as shown in FIG. 5A), and at least one rigid bushing member 705 having a curved inner surface on a second side of the spring-loaded bushing 425a. Thus, the first spring-loaded bushing 425a provides two-dimensional spring forces to provide origin positioning of the picking-section plate 210 and placing-section member 310 via the picking-section plate pins and placing-section member pins 325a, respectively.

The second spring-loaded bushing 425b is spring-loaded in one dimension so as to (i) provide angle alignment between the picking-section plate 210 and the pick-and-place head plate 410 when the picking-section plate 210 is engaged with the pick-and-place head plate 410, and (ii) provide angle alignment between the placing-section member 310 and the pick-and-place head plate 410 when the placing-section member 310 is engaged with the pick-and-place head plate 410. To that end, the second spring-loaded bushing 425b includes at least one spring bushing member 800 having a curved inner surface on a first side of the second spring-loaded bushing 425b (e.g., two spring bushing members 800, as shown in FIG. 5B), and at least one rigid bushing member 805 having a flat inner surface on a second side of the second spring-loaded bushing 425b. Thus, the second spring-loaded bushing 425b provides one-dimensional spring forces to provide angle positioning of the picking-section plate 210 and placing-section member 310 via the picking-section plate pin 225b and placing-section member pins 325b, respectively.

The pick-and-place head plate 410 includes a plurality of pick-and-place head plate fiducials 430 on the top surface thereof. As shown in FIG. 4A, a plurality of fiducials 430 are provided on each lateral side of each pick-and-place head contactor opening 415. The purpose of the fiducials 430 is described in more detail below.

Optical Sensing System

Figure 6:
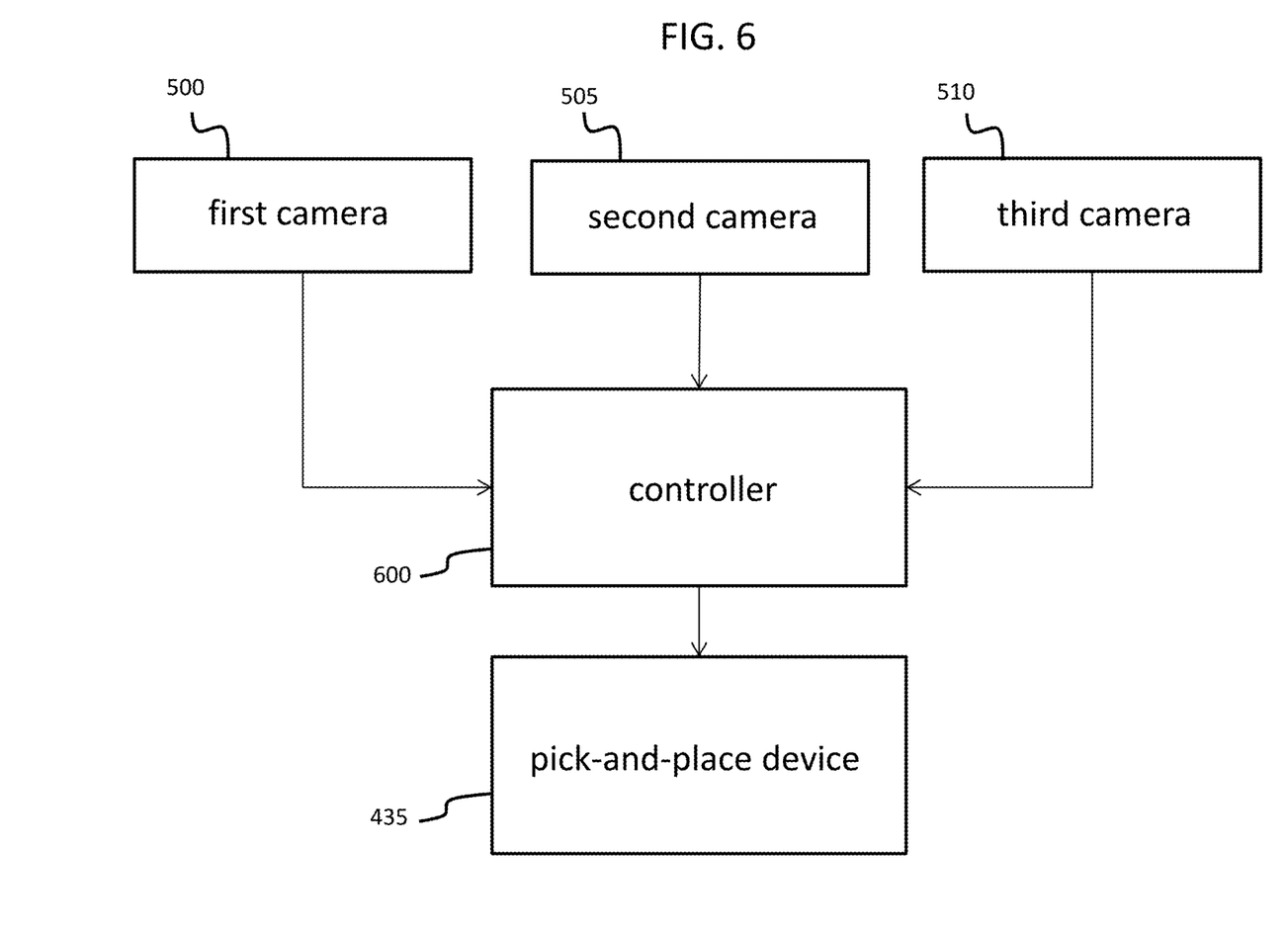
FIG. 6 is a schematic view showing the operative relationship between a controller and various other components of a system for double sided integrated circuit device testing according to an embodiment of the invention.

The optical sensing system includes a first camera 500, a second camera 505, and a third camera 510, as shown in FIGS. 1 and 6.

The first camera 500 is a downward looking camera configured to view an area of the top surface 220 of the picking-section plate 210 and the integrated circuit devices located in the picking-section pockets.

The second camera 505 is an upward looking camera configured to view an area of the bottom surface 420 of the pick-and-place head plate 410 and the integrated circuit devices located on pick-and-place head contactors 405.

The third camera 510 is a downward looking camera configured to view an area of the top surface 320 of the placing-section member 310.

Controller

The controller 600, shown in FIG. 6, is configured to receive inputs from the first camera 500, the second camera 505, and a third camera 510.

The controller 600 is configured to control the one or more sets of actuators 440a, 440b, 440c to correct an offset between first terminal arrays on first sides of the plurality of integrated circuit devices, and the plurality of pick-and-place head contactors 405, based on data received from the first camera 500. The controller 600 is configured to determine the offset between the first terminal arrays and the plurality of pick-and-place head contactors 405 based on virtual images of the pick-and-place head contactors 405 that are mapped to the picking-section plate 210, by determining an offset between (i) the first terminal arrays and (ii) the picking-section pocket openings 215 and/or the picking-section plate fiducials 230. The virtual images of the pick-and-place head contactors 405 are mapped to the picking-section plate 210 during calibration of the system 100, as described in more detail below.

The controller 600 is configured to control the one or more sets of actuators 440a, 440b, 440c to correct an offset between second terminal arrays on second sides of the plurality of integrated circuit devices, and the plurality of placing-section contactors 305, based on data received from the at second camera 505. The controller 600 is configured to determine the offset between the second terminal arrays and the plurality of placing-section contactors 305 based on virtual images of the placing-section contactors 305 that are mapped to the pick-and-place head plate 410, by determining an offset between (i) the second terminal arrays and (ii) the pick-and-place head contactor openings and/or the pick-and-place head plate fiducials 430. The virtual images of the placing-section contactors 305 are mapped to the pick-and-place head plate 410 during calibration of the system 100, as described in more detail below.

Figure 7:
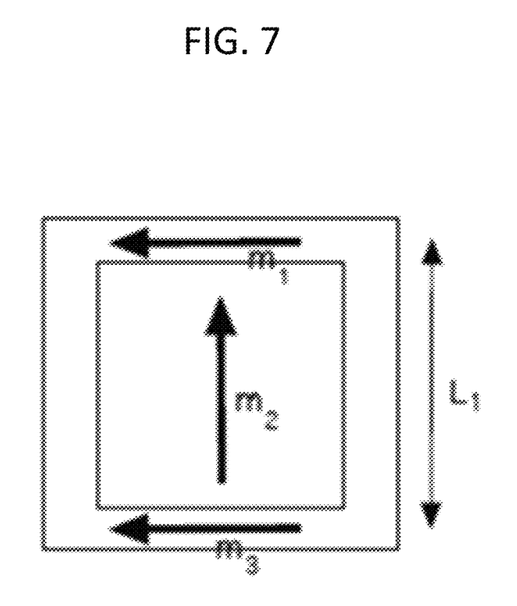
FIG. 7 shows actuator vectors used in calculating alignment offsets according to an embodiment of the invention.

As an example of a transform used to control the actuators for vision alignment, define:

$\tilde{m}$=victor containing the 3 actuators
$\tilde{x}$=victor containing the 3 device displacements (x, y, θ)
A=matrix to convert the actuator displacements to device displacements Then, referring to FIG. 7:

$$\tilde{A} = \begin{bmatrix} a_{11} & a_{12} & a_{13} \\ a_{21} & a_{22} & a_{23} \\ a_{31} & a_{32} & a_{33} \end{bmatrix}; \tilde{m} = \begin{bmatrix} m_1 \\ m_2 \\ m_3 \end{bmatrix}; \tilde{x} = \begin{bmatrix} x \\ y \\ \theta \end{bmatrix}$$

Then, the relation between the 3 actuators and the 3 degree displacement is:

$$\tilde{A}\tilde{m} = \tilde{x}$$

Determining conversion matrix A can be performed as follows:

Define:

$$x = \frac{C_1 m_1 + C_3 m_3}{2} = \frac{1}{2}C_1 m_1 + 0 * m_2 + \frac{1}{2}C_3 m_3$$

$$y = C_2 m_2 = 0 * m_1 + C_2 m_2 + 0 * m_3$$

$$\tan\theta = C_4\left(\frac{C_1 m_1 - C_3 m_3}{L_1}\right) = \tan\theta \approx \theta \text{ (for small } \theta\text{)}$$

$$\theta = \frac{C_4 C_1}{L_1} m_1 + 0 * m_2 - \frac{C_5 C_3}{L_1} m_3$$

therefore:

$$\tilde{A} = \begin{bmatrix} a_{11} & a_{12} & a_{13} \\ a_{21} & a_{22} & a_{23} \\ a_{31} & a_{32} & a_{33} \end{bmatrix} = \begin{bmatrix} \frac{C_1}{2} & 0 & \frac{C_3}{2} \\ 0 & C_2 & 0 \\ \frac{C_4 C_1}{L_1} & 0 & -\frac{C_5 C_3}{L_1} \end{bmatrix}$$

-continued

Where:

$C_n$ = equals conversion factor from encoder (bits) to desired length unit (μm, mm, etc.)

$C_4$ = equals conversion factor from radians to desired angle units (degrees, mrads, etc.)

$L_1$ = distance between $m_1 m_3$ $m_n$ = equals the displacement

Note that ideally $C_1 = C_2 = C_3$

Calibration of the System

Next, the calibration of the system 100 for double sided integrated circuit device testing will be described.

First, before mounting the picking-section plate 210 to the picking-section pockets 205, the picking-section plate 210 is mounted to the pick-and-place head plate 410 on the pick-and-place device 435 (separate from the picking-section pockets 205) such that the first and second picking-section plate pins 225a, 225b engage with the first and second spring-loaded bushings 425a, 425b, respectively. The bottom surface of the picking-section plate 210 is viewed with the second camera 505, along with the pick-and-place head contactors 305. The controller 600 then maps the pick-and-place head contactors 405 to the picking-section plate 210. In other words, the controller 600 determines the location of the pick-and-place head contactors 405 with respect to features of the picking-section plate 210 that can later be viewed by the first camera 500 during runtime, such as the picking-section pocket openings 215 and/or the picking section plate fiducials 230. For example, each individual pick-and-place head contactor 305 can be mapped to a respective picking-section pocket opening 215 and/or to a respective group of picking section plate fiducials 230. In this manner, it is possible, during runtime, to control the sets of actuators 440a, 440b, 440c to correct an offset between the first terminal arrays on first sides of the plurality of integrated circuit devices, and the plurality of pick-and-place head contactors 405, based on data received from the first camera 500, by comparing a real image of the first terminal arrays to the virtual image of the pick-and-place head contactors 405. After the pick-and-place head contactors 405 are mapped to the picking-section plate 210, the picking-section plate 210 is mounted on the picking-section pockets 205.

Second, before mounting the pick-and-place head plate 410 to the pick-and-place device 435, the pick-and-place head plate 410 is mounted to the placing-section member 310 on the placing-section contactors (separate from the pick-and-place device 435) such that the first and second placing-section member pins 325a, 325b engage with the first and second spring-loaded bushings 425a, 425b, respectively. The top surface of the pick-and-place head plate 410 is viewed with the third camera 410, along with the placing-section contactors 305. The controller 600 then maps the placing-section contactors 305 to the pick-and-place head plate 410. In other words, the controller 600 determines the location of the placing-section contactors 305 with respect to features of the pick-and-place head plate 410 that can later be viewed by the second camera 505 during runtime, such as the pick-and-place head contactor openings 415 and/or the pick-and-place head plate fiducials 430. For example, each individual placing-section contactor 305 can be mapped to a respective pick-and-place head contactor opening 415 and/or to a respective group of pick-and-place head plate fiducials 430. In this manner, it is possible, during runtime, to control the sets of actuators 440a, 440b, 440c to correct an offset between the second terminal arrays on second sides of the plurality of integrated circuit devices, and the plurality of placing-section contactors 305, based on data received from the second camera 505, by comparing a real image of the second terminal arrays to the virtual image of the placing-section contactors 305. After the placing-section contactors 305 are mapped to the pick-and-place head plate 410, the pick-and-place head plate 410 is mounted on the pick-and-place device 435.

As discussed above, the pick-and-place head plate 410 is mapped to the placing-section member during calibration. When the placing-section contactor 305 is replaced, the relationship between the pick-and-place head plate 410 and the placing-section contactor 305 must be redetermined. Rather than placing the pick-and-place head plate 410 back onto the placing-section member 310, the placing-section member fiducials 330 on the placing-section member 310 can be viewed with the third camera 510 to determine the relationship between the pick-and-place head plate 410 and the placing-section member 310.

Operation of the System During Runtime

Next, the operation of the system 100 for double sided integrated circuit device testing, during runtime, will be described.

During runtime, the picking-section plate 210 is mounted on the picking-section pockets 205, and the pick-and-place head plate 410 is mounted on the pick-and-place device 435.

First, the first camera 500 views the top surface 220 of the picking-section plate 210 along with the integrated circuit devices located in the picking-section pockets 205. The controller 600 receives data from the first camera 500 and determines the X, Y, and angle offsets between each of the first terminal arrays on the top surfaces of the integrated circuit devices and each of the pick-and-place head contactors 405. By detecting the location of the picking-section pocket openings 215 and/or the picking-section plate fiducials 230, the controller 600 can determine the offset between a real image of the first terminal arrays and the virtual image of the pick-and-place head contactors 405. The one or more sets of actuators 440a, 440b, 440c then corrects the location of the pick-and-place head contactors 305. In the embodiment shown in FIGS. 4A and 4B, a single set of actuators 440a, 440b, 440c is provided for multiple pick-and-place head contactors 405. Thus, alignment is performed by aligning a first pick-and-place head contactor 405, locking the first pick-and-place head contactor 405 in place, aligning the next pick-and-place head contactor 405, locking the next pick-and-place head contactor 405 in place, and repeating this process for the remaining pick-and-place head contactors 405 until alignment of pick-and-place head contactors 405 is complete. After alignment is complete, the pick-and-place device 435 picks up the integrated circuit devices as a group from the picking-section pockets 205, with the picking-section plate pins 225a, 225b engaging with first and second spring loaded bushings 425a, 425b. Thus, the first terminal arrays are aligned to the pick-and-place head contactors 405.

Next, the second camera 505 views the bottom surface 420 of the pick-and-place head plate 410 along with the integrated circuit devices loaded in the pick-and-place device 435. The controller 600 receives data from the second camera 505 and determines the X, Y, and angle offsets between each of the second terminal arrays on the bottom surfaces of the integrated circuit devices and each of the placing-section contactors 305. By detecting the location of the pick-and-place head contactor openings 415 and/or the pick-and-place head plate fiducials 430, the controller 600 can determine the offset between a real image of the second terminal arrays and the virtual image of the placing-section contactors 305. The one or more sets of actuators 440a, 440b, 440c then corrects the location of the pick-and-place head contactors 305 (with the integrated circuit devices mounted thereto). In the embodiment shown in FIGS. 4A and 4B, a single set of actuators 440a, 440b, 440c is provided for multiple pick-and-place head contactors 405. Thus, alignment is performed by aligning a first pick-and-place head contactor 405, locking the first pick-and-place head contactor 405 in place, aligning the next pick-and-place head contactor 405, locking the next pick-and-place head contactor 405 in place, and repeating this process for the remaining pick-and-place head contactors 405 until alignment of pick-and-place head contactors 405 is complete. After alignment is complete, the pick-and-place device 435 plunges the integrated circuit devices as a group into the placing-section contacotrs 305, with the placing-section member pins 325a, 325b engaging with first and second spring loaded bushings 425a, 425b. Thus, the second terminal arrays are aligned to the placing section contactors 305.

Other Embodiments

Figure 4A:
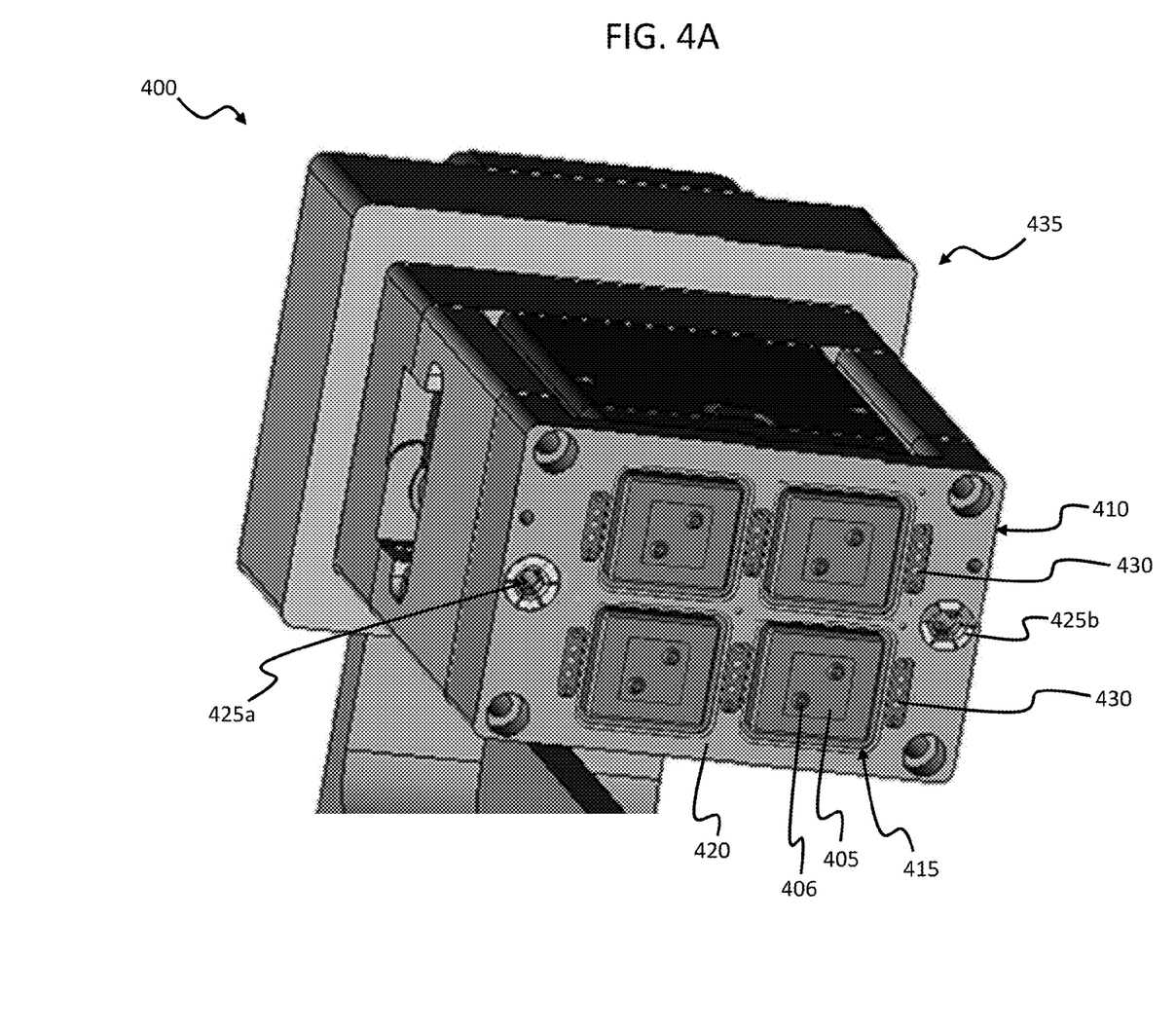
FIG. 4A is a bottom perspective view of a pick-and-place device according to an embodiment of the invention.
Figure 4B:
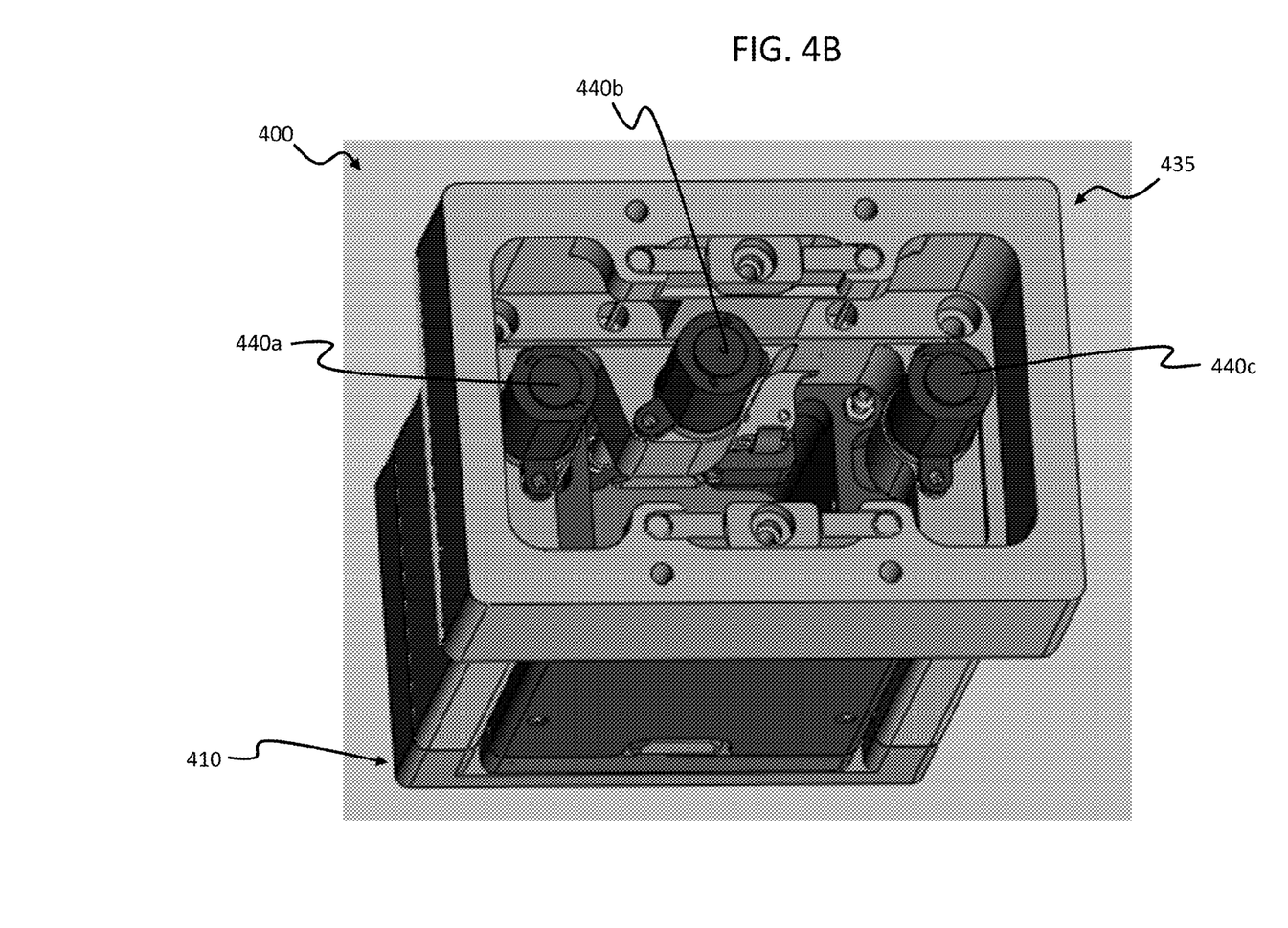
FIG. 4B is a top perspective view of a pick-and-place device according to an embodiment of the invention.

In the embodiment shown in FIGS. 4A and 4B, a single set of actuators 440a, 440b, 440c is provided for multiple pick-and-place head contactors 405. Thus, alignment is performed by aligning a first pick-and-place head contactor 405, locking the first pick-and-place head contactor 405 in place, aligning the next pick-and-place head contactor 405, locking the next pick-and-place head contactor 405 in place, and repeating this process for the remaining pick-and-place head contactors 405 until alignment of pick-and-place head contactors 405 is complete. However, multiple sets of actuators 440a, 440b, 440c may be provided (e.g., one actuator set for every two pick-and place head contactors 405, or one actuator set for every pick-and place head contactor 405). In this case, alignment with the multiple actuator sets can be done simultaneously. This decreases the time required for alignment, but increases the space needed for actuators and increases the cost of the system.

The types of integrated circuit devices that can be tested using the above-described system include, for example, package-on-package ("PoP"). Suitable PoP devices may have, for example, land-grid-array ("LGA") pads as the top terminal arrays and ball-grid-array ("BGA") balls as the bottom terminal arrays. During alignment, the controller 600 is preferably configured to detect the terminal arrays of the integrated circuit devices directly, rather than detecting edges of the integrated circuit devices. Because the contrast between the terminal arrays and other portions of the integrated circuit devices is not always good, the vision alignment in embodiments of the invention may use one more row and one additional column on each side of the contactor terminal arrays with the same position tolerance, to simplify the mechanical design. The contactor material may be lighter in color, for contrast.

The embodiment shown in FIGS. 4A and 4B includes three micro-motor based actuators 440a, 440b, 440c. Alternatively, shape memory alloy ("SMA") based linear actuators may be used. SMA wire based actuators are able to remember the length changes that occur in different temperatures, and can therefore be controlled well electronically even during temperature fluctuations. SMA actuators are small and can maximize the strength-to-space ratio of the actuators. With encoder feedback, closed-loop servo control is possible.

A single system 100 may include multiple picking-section plates 210, multiple placing-section members 310, and multiple pick-and-place head plates 410. For example, a system 100 may include multiple picking section plates 210 for a single set of picking-section pockets 205, multiple placing-section members 310 for a single set of placing-section contactors, and multiple pick-and-place head plates 410 for a single pick-and-place device 435. In this case, multiple first cameras 500, multiple second cameras 505, and multiple third camera 510 can be provided. For example, a first camera 500 can be provided for each of the picking-section plates 210, a second camera 505 can be provided for each of the pick-and-place head plates 410, and a third camera 510 can be provided for each of the placing-section members 310.

The foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and its practical application to enable one skilled in the art to utilize the present invention in various embodiments and with various modifications as are suited to the particular use contemplated. The features of the embodiments described herein may be combined in all possible combinations of methods, apparatus, modules, systems, and computer program products.

Further, while the present disclosure uses terms such as "x-axis," "y-axis," "z-axis" "x-direction," "y-direction," and "z-direction," these terms are not intended to be limiting. Rather, these terms are simply relative terms used for clarity.

What is claimed is:

1. A system for double sided integrated circuit device testing, the system comprising:
   (i) a picking section comprising:
      (a) a plurality of picking-section pockets, each picking-section pocket configured to hold an integrated circuit device;
      (b) a picking-section plate comprising:
         one or more picking-section pocket openings, each picking-section pocket opening corresponding to one of the picking-section pockets, and
         first and second picking-section plate pins extending from a surface of the picking-section plate;
   (ii) a placing section comprising:
      (a) a plurality of placing-section contactors;
      (b) a placing-section member comprising:
         one or more placing-section contactor openings, each placing-section contactor opening corresponding to a placing-section contactor, and
         first and second placing-section member pins extending from a surface of the placing-section member; and (iii) a pick-and-place section comprising:
  (a) a pick-and-place device comprising:
    a plurality of pick-and-place head contactors, and
    one or more sets of actuators configured to adjust an X position, Y position, and angle of rotation of the plurality of pick-and-place head contactors,
    wherein the pick-and-place device is configured to transport a plurality of the integrated circuit devices from the plurality of picking-section pockets to the plurality of placing-section contactors; and
  (b) a pick-and-place head plate comprising:
    one or more pick-and-place head contactor openings, each pick-and-place head contactor opening corresponding to a pick-and-place head contactor, and
    first and second spring-loaded bushings configured to engage with the first and second picking-section plate pins, and the first and second placing-section member pins.

2. The system of claim 1, further comprising:
a first camera configured to view the picking-section plate and a plurality of integrated circuit devices located in the picking-section pockets; and
a second camera configured to view the pick-and-place head plate and a plurality of integrated circuit devices located in the pick-and-place head contactors.

3. The system of claim 2, further comprising:
at least one controller configured to:
  control the one or more sets of actuators to correct an offset between first terminal arrays on first sides of the plurality of integrated circuit devices, and the plurality of pick-and-place head contactors, based on data received from the first camera, and
  control the one or more sets of actuators to correct an offset between second terminal arrays on second sides of the plurality of integrated circuit devices, and the plurality of placing-section contactors, based on data received from the second camera.

4. The system of claim 3, wherein the at least one controller is configured to determine the offset between the first terminal arrays and the plurality of pick-and-place head contactors based on virtual images of the pick-and-place head contactors that are mapped to the picking-section plate, by determining an offset between the first terminal arrays and the picking-section pocket openings.

5. The system of claim 3, wherein the at least one controller is configured to determine the offset between the second terminal arrays and the plurality of placing-section contactors based on virtual images of the placing-section contactors that are mapped to the pick-and-place head plate, by determining an offset between the second terminal arrays and the pick-and-place head contactor openings.

6. The system of claim 3,
wherein the at least one controller is configured to determine the offset between the first terminal arrays and the plurality of pick-and-place head contactors based on virtual images of the pick-and-place head contactors that are mapped to the picking-section plate, by determining an offset between the first terminal arrays and the picking-section pocket openings, and
wherein the at least one controller is configured to determine the offset between the second terminal arrays and the placing-section contactors based on virtual images of the placing-section contactors that are mapped to the pick-and-place head plate, by determining an offset between the second terminal arrays and the pick-and-place head contactor openings.

7. The system of claim 1, wherein the pick-and-place device includes one set of the actuators for each of the pick-and-place head contactors.

8. The system of claim 1, wherein the pick-and-place device includes one set of actuators configured to sequentially align two or more of the pick-and-place head contactors.

9. The system of claim 8, wherein the pick-and-place device is configured such that, after a first pick-and-place head contactor is aligned, said first pick-and-place head contactor can be locked in a corrected position before a second pick-and-place head contactor is aligned.

10. The system of claim 1, wherein each of the one or more sets of actuators includes three linear actuators.

11. The system of claim 10, wherein the linear actuators are micro-motor based linear actuators.

12. The system, of claim 10, wherein the linear actuators are shape memory alloy based linear actuators.

13. The system of claim 1, wherein the first spring-loaded bushing is spring-loaded in two dimensions so as to (i) provide origin alignment between the picking-section plate and the pick-and-place head plate when the picking-section plate is engaged with the pick-and-place head plate, and (ii) provide origin alignment between the placing-section member and the pick-and-place head plate when the placing-section member is engaged with the pick-and-place head plate.

14. The system of claim 1, wherein the second spring-loaded bushing is spring-loaded in one dimension so as to (i) provide angle alignment between the picking-section plate and the pick-and-place head plate when the picking-section plate is engaged with the pick-and-place head plate, and (ii) provide angle alignment between the placing-section member and the pick-and-place head plate when the placing-section member is engaged with the pick-and-place head plate.

15. The system of claim 1,
wherein the first spring-loaded bushing is spring-loaded in two dimensions so as to (i) provide origin alignment between the picking-section plate and the pick-and-place head plate when the picking-section plate is engaged with the pick-and-place head plate, and (ii) provide origin alignment between the placing-section member and the pick-and-place head plate when the placing-section member is engaged with the pick-and-place head plate, and
wherein the second spring-loaded bushing is spring-loaded in one dimension so as to (i) provide angle alignment between the picking-section plate and the pick-and-place head plate when the picking-section plate is engaged with the pick-and-place head plate, and (ii) provide angle alignment between the placing-section member and the pick-and-place head plate when the placing-section member is engaged with the pick-and-place head plate.

16. The system of claim 1, wherein the picking-section pocket openings extend entirely through the picking-section plate so as to be visible from both sides of the picking-section plate.

17. The system of claim 1, wherein the pick-and-place head contactor openings extend entirely through the pick-and-place head plate so as to be visible from both sides of the pick-and-place head plate.

18. The system of claim 1, wherein the picking-section plate includes a plurality of fiducials on said surface of the picking-section plate.

19. The system of claim 1, wherein the pick-and-place head plate includes a plurality of fiducials on said surface of the pick-and-place head plate.

20. The system of claim 3,
wherein the picking-section plate includes a plurality of fiducials on said surface of the picking-section plate, and
wherein the at least one controller is configured to determine the offset between the first terminal arrays and the plurality of pick-and-place head contactors based on virtual images of the pick-and-place head contactors that are mapped to the picking-section plate, by determining an offset between the first terminal arrays and the plurality of fiducials.

21. The system of claim 3,
wherein the pick-and-place head plate includes a plurality of fiducials on said surface of the pick-and-place head plate, and
wherein the at least one controller is configured to determine the offset between the second terminal arrays and the placing-section contactors based on virtual images of the placing-section contactors that are mapped to the pick-and-place head plate, by determining an offset between the second terminal arrays and the plurality of fiducials.

22. The system of claim 3,
wherein the picking-section plate includes a first plurality of fiducials on said surface of the picking-section plate,
wherein the at least one controller is configured to determine the offset between the first terminal arrays and the plurality of pick-and-place head contactors based on virtual images of the pick-and-place head contactors that are mapped to the picking-section plate, by determining an offset between the first terminal arrays and the first plurality of fiducials,
wherein the pick-and-place head plate includes a second plurality of fiducials on said surface of the pick-and-place head plate, and
wherein the at least one controller is configured to determine the offset between the second terminal arrays and the placing-section contactors based on virtual images of the placing-section contactors that are mapped to the pick-and-place head plate, by determining an offset between the second terminal arrays and the second plurality of fiducials.

23. A method of performing double sided integrated circuit device testing, the method comprising:
providing a system for double sided integrated circuit device testing, the system comprising:
(i) a picking section comprising:
(a) a plurality of picking-section pockets, each picking-section pocket configured to hold an integrated circuit device,
(b) a picking-section plate comprising:
one or more picking-section pocket openings, each picking-section pocket opening corresponding to one of the picking-section pockets, and
first and second picking-section plate pins extending from a surface of the picking-section plate, (ii) a placing section comprising:
(a) a plurality of placing-section contactors,
(b) a placing-section member comprising:
one or more placing-section contactor openings, each placing-section contactor opening corresponding to a placing-section contactor, and
first and second placing-section member pins extending from a surface of the placing-section member, and
(iii) a pick-and-place section comprising:
(a) a pick-and-place device comprising:
a plurality of pick-and-place head contactors, and
one or more sets of actuators configured to adjust an X position, Y position, and angle of rotation of the plurality of pick-and-place head contactors,
wherein the pick-and-place device is configured to transport a plurality of the integrated circuit devices from the plurality of picking-section pockets to the plurality of placing-section contactors, and
(b) a pick-and-place head plate comprising:
one or more pick-and-place head contactor openings, each pick-and-place head contactor opening corresponding to a pick-and-place head contactor, and
first and second spring-loaded bushings configured to engage with the first and second picking-section plate pins, and the first and second placing-section member pins;
viewing a picking-section plate and a plurality of integrated circuit devices located in picking-section pockets with a first camera;
controlling the one or more sets of actuators to correct an offset between first terminal arrays on first sides of the plurality of integrated circuit devices, and the plurality of pick-and-place head contactors, based on data received from the first camera;
picking the plurality of integrated circuit devices from the picking-section pockets such that the plurality of integrated circuit devices engage with the pick-and-place head contactors;
viewing the pick-and-place head plate and the plurality of integrated circuit devices located in the pick-and-place head contactors with a second camera;
controlling the one or more sets of actuators to correct an offset between the second terminal arrays on second sides of the plurality of integrated circuit devices, and the plurality of placing-section contactors, based on data received from the second camera; and
placing the plurality of integrated circuit devices into the placing-section contactors.

24. The method of claim 23, further comprising a step of calibrating the system, wherein the step of calibrating the system comprises:
mounting the picking-section plate on the pick-and-place head plate such that the first and second picking-section plate pins engage the first and second spring-loaded bushings;
viewing the picking-section plate mounted on the pick-and-place head plate with the second camera; and
mapping the plurality of pick-and-place head contactors as virtual images to the picking-section plate.

25. The method of claim 24, wherein the step of calibrating the system further comprises:

mounting the pick-and-place head plate on the placing-section member such that the first and second placing-section member pins engage the first and second spring-loaded bushings;

viewing the pick-and-place head plate mounted on the placing-section member with a third camera; and mapping the plurality of placing-section contactors as virtual images to the pick-and-place head plate.

\* \* \* \* \*